(12) United States Patent
Brass et al.

(10) Patent No.: US 6,880,055 B2
(45) Date of Patent: Apr. 12, 2005

(54) SEMICONDUCTOR MEMORY DEVICE

(75) Inventors: Eckhard Brass, Unterhaching (DE); Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 222 days.

(21) Appl. No.: 10/260,899

(22) Filed: Sep. 30, 2002

(65) Prior Publication Data

US 2003/0062547 A1 Apr. 3, 2003

(30) Foreign Application Priority Data

Sep. 28, 2001 (DE) .......................................... 101 47 956

(51) Int. Cl.⁷ .............................................. G06F 12/00
(52) U.S. Cl. ...................... 711/167; 711/170; 711/172; 713/501; 713/600; 365/233
(58) Field of Search .............................. 711/167, 170, 711/172; 713/500, 501, 600; 365/233

(56) References Cited

U.S. PATENT DOCUMENTS

| | | | |
|---|---|---|---|
| 5,790,564 A | 8/1998 | Adams et al. ............... 714/738 |
| 5,883,853 A | 3/1999 | Zheng et al. ............... 365/233 |
| 5,940,608 A | * 8/1999 | Manning ..................... 713/503 |
| 5,956,289 A | 9/1999 | Norman et al. ............. 365/233 |
| 6,115,833 A | 9/2000 | Sato et al. .................. 714/718 |
| 6,125,073 A | * 9/2000 | Le et al. ................. 365/230.03 |
| 6,182,207 B1 | 1/2001 | Poivre et al. ............... 712/225 |
| 6,628,566 B2 | * 9/2003 | Jeong .................... 365/230.06 |
| 6,738,309 B2 | * 5/2004 | Benedix et al. ............. 365/233 |
| 2003/0062547 A1 | * 4/2003 | Brass et al. ................. 257/200 |

OTHER PUBLICATIONS

"User manual MPC8260" *Motorola*, 1999, Rev. 0, pp. 9–1–10–59.

* cited by examiner

*Primary Examiner*—Donald Sparks
*Assistant Examiner*—Brian R. Peugh
(74) *Attorney, Agent, or Firm*—Laurence A. Greenberg; Werner H. Stemer; Gregory L. Mayback

(57) ABSTRACT

So that semiconductor memory devices can be used optimally with regard to different possible operating frequencies, according to the invention, a register area is formed in which frequency information with regard to a present operating frequency can be stored in coded form and be retrieved for a configuration and adaptation of the semiconductor memory device.

40 Claims, 2 Drawing Sheets

SEMICONDUCTOR MEMORY DEVICE

BACKGROUND OF THE INVENTION

Field of the Invention

The invention relates to a semiconductor memory device having at least one memory area.

Semiconductor memory devices are used in some form in very many different types of electronic apparatuses. Despite efforts to establish standards for semiconductor memory devices, these different fields of application entail accessing or having to access, during operation, the semiconductor memory devices used with different clock frequencies.

In the construction of the circuit configurations on which semiconductor memory devices are based, a considerable effort is made to fulfill, in circuitry terms, the different demands and operating conditions with regard to the operating frequencies or clock frequencies.

The circuitry properties and the operating parameters of semiconductor memory devices could be improved further, if, during operation, corresponding frequency information with regard to the operating frequency or clock frequency that is applied to the semiconductor memory device were ready to be retrieved.

SUMMARY OF THE INVENTION

It is accordingly an object of the invention to provide a semiconductor memory device that overcomes the hereinafore-mentioned disadvantages of the heretofore-known devices of this general type and that can be adapted and configured with regard to different operating frequencies or clock frequencies, in a particularly simple manner.

With the foregoing and other objects in view, there is provided, in accordance with the invention, a semiconductor memory device, including at least one memory area and a register area at least one of receiving, storing, and providing frequency information selected from at least one of the group consisting of a present operating frequency, a clock frequency, and a frequency range for operating the semiconductor memory device.

The semiconductor memory device according to the invention is characterized by providing a register area that is configured for receiving, storing, and/or providing frequency information with regard to a present operating frequency or clock frequency and/or a frequency range of the semiconductor memory device.

Consequently, it is a basic idea of the present invention to provide the information—necessary for operation—with regard to the operating frequency or clock frequency in the area of the semiconductor memory device itself, a register area being provided for receiving, storing, and/or reproducing or providing the frequency information. The frequency information that can be received, and reproduced, on the chip of the semiconductor memory device can be utilized directly for optimizing the operation of the semiconductor memory device in the case of different frequency ranges.

Although it is conceivable that the frequency information in the register area actually in each case determines a concrete operating frequency or clock frequency, it is generally also provided that the frequency information designates contiguous regions or intervals in the range of possible operating frequencies or clock frequencies.

For example, in the case of a semiconductor memory that can be operated in the overall frequency range from 66 MHz to 133 MHz, this frequency range can be subdivided into two or more contiguous, non-overlapping subranges, e.g., 66 MHz to 99 MHz, a low-frequency range, and 100 MHz to 133 MHz, a high-frequency range. The intervals or subranges need not be of the same length.

In accordance with another feature of the invention, the register area is configured for binary coded storage of the frequency information.

In such a case, the register area has at least one, preferably a plurality, in particular, two or three, register bits. It is furthermore provided that each possible operating frequency or clock frequency provided is associated with a combination of values of the register bits. This means that, according to the invention, the clock frequency as such is not represented, rather, an assignment is effected in binary coded form between a bit combination of the register bits of the register area and the respective operating frequency and clock frequency. In such a case, the corresponding possible operating frequencies or clock frequencies or ranges thereof must, therefore, be defined internally in the configuration of the semiconductor memory device. The assignment between bit combinations and the corresponding operating frequencies or operating frequency ranges is, thus, defined by hardware, for example.

In accordance with a further feature of the invention, it is advantageous that the memory area of the semiconductor memory device and/or the register area are configured such that the frequency information can be written to the register area externally. Consequently, it may be provided, then, that at the beginning of operation or in the event of an operating frequency change, an external memory control unit (memory controller) writes the corresponding frequency information to the register area by an initialization process or re-initialization process.

As an alternative or in addition thereto, in accordance with an added feature of the invention, it may be provided that the memory area and, in particular, the register area are configured such that the frequency information can be written to the register area internally.

In such a case, then, in accordance with yet another feature of the invention, there is provided, if appropriate, an internal frequency-determining device, by which the present operating frequency and/or clock frequency of the semiconductor memory device can be determined and written to the register area. Such a measure ensures that even in the event of external changes in the operating conditions, optimum operation of the semiconductor memory device can be carried out by automatic adaptation and reconfiguration.

In accordance with yet a further feature of the invention, the semiconductor memory device and, in particular, the memory area are configured to adapt and/or to configure their circuit components, their circuit configuration, their function, and/or their operation to a present operating frequency and/or clock frequency in accordance with the frequency information present in the register area.

In accordance with an additional feature of the invention, also advantageous is a semiconductor memory device that, based upon the frequency information in the register area, can be adapted and/or configured with regard to the signal propagation times and/or the temporal coordination of operation. This enables, in a particularly simple and reliable manner, a correct assignment of different signal components and signal levels, in particular, in the memory area.

In accordance with yet an added feature of the invention, based upon the frequency information in the register area, circuit components, circuit configurations, function, and operation, in particular, of the memory area, can be adapted and/or configured in terms of their electrical power consumption.

In such a case, in particular, an adaptation to a higher power consumption can be carried out or configured at higher operating frequencies or clock frequencies and an adaptation to a lower power consumption can be carried out or configured at lower operating frequencies or clock frequencies.

According to an adapted or configured power consumption, the power provision or generation can be adapted and/or configured in accordance with the frequency information in the register area.

Such is accomplished, for example, by adapting and/or configuring the power provision or generation in accordance with the frequency information in the register area by a number of activated or activatable power generator elements.

In particular, a larger number of power generator elements is activated or can be activated at higher operating frequencies, and a smaller number at lower operating frequencies.

It is particularly advantageous that the register area is configured as part of an existing register, in particular, of a mode register or the like. In accordance with such an embodiment, then, an already existing register that is customary in many conventional semiconductor memory devices can be concomitantly utilized to store the frequency information so that an additional outlay with regard to the further development of conventional memory devices remains reasonable or is obviated.

In accordance with a concomitant feature of the invention, refinements of the semiconductor memory device as an SDRAM, DDR-SDRAM, or the like are particularly advantageous.

These and further properties of the present invention emerge from the explanations in the following text.

In synchronous DRAM products, information about the present operating frequency is not available in the circuits that are used internally. They must function reliably, however, over a large potential frequency range. Many circuits could be optimized with regard to their properties if an item of frequency information were available internally.

Therefore, the invention proposes an additional internal register in which the present operating frequency is and has been stored in coded form. Such information is set, e.g., by an external memory controller during the initialization of the memory module.

By contrast, conventional internal circuits for semiconductor memory devices are configured for a large possible frequency range overall. These conventional circuits are not optimally adapted to specific frequencies in terms of their properties.

The frequency information available according to the invention makes it possible to optimize timing-relevant circuits with regard to function and area requirement. In addition, the current consumption can be reduced by virtue of the circuits being better adapted to the instantaneously required operating speed and, therefore, only taking up the power that is actually absolutely required.

One idea of the invention lies in the provision of an additional internal register in which the present operating frequency is and has been stored in coded form. The information can be used by various circuits for optimizing their properties.

The frequency information is stored, e.g., in binary coded form in simple flip-flops. In such a case, a resolution of a few bits may suffice, in practice, for coding a few relevant frequency ranges.

An extension of a mode register that is present anyway in SDRAMs is conceivable as a concrete implementation.

With the objects of the invention in view, there is also provided a semiconductor memory device, including at least one memory area and a register area connected to the at least one memory area and adapted to at least one of receive, store, and provide frequency information selected from at least one of the group consisting of a present operating frequency, a clock frequency, and a frequency range for operating the at least one memory area.

With the objects of the invention in view, there is also provided a semiconductor memory device, including at least one memory area, a register area adapted to at least one of receive, store, and provide frequency information selected from at least one of the group consisting of a present operating frequency, a clock frequency, and a frequency range for operating the at least one memory area, and a controller for at least one of receiving and transmitting commands and addresses externally, the a controller connected to the at least one memory area and the register area.

Other features that are considered as characteristic for the invention are set forth in the appended claims.

Although the invention is illustrated and described herein as embodied in a semiconductor memory device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
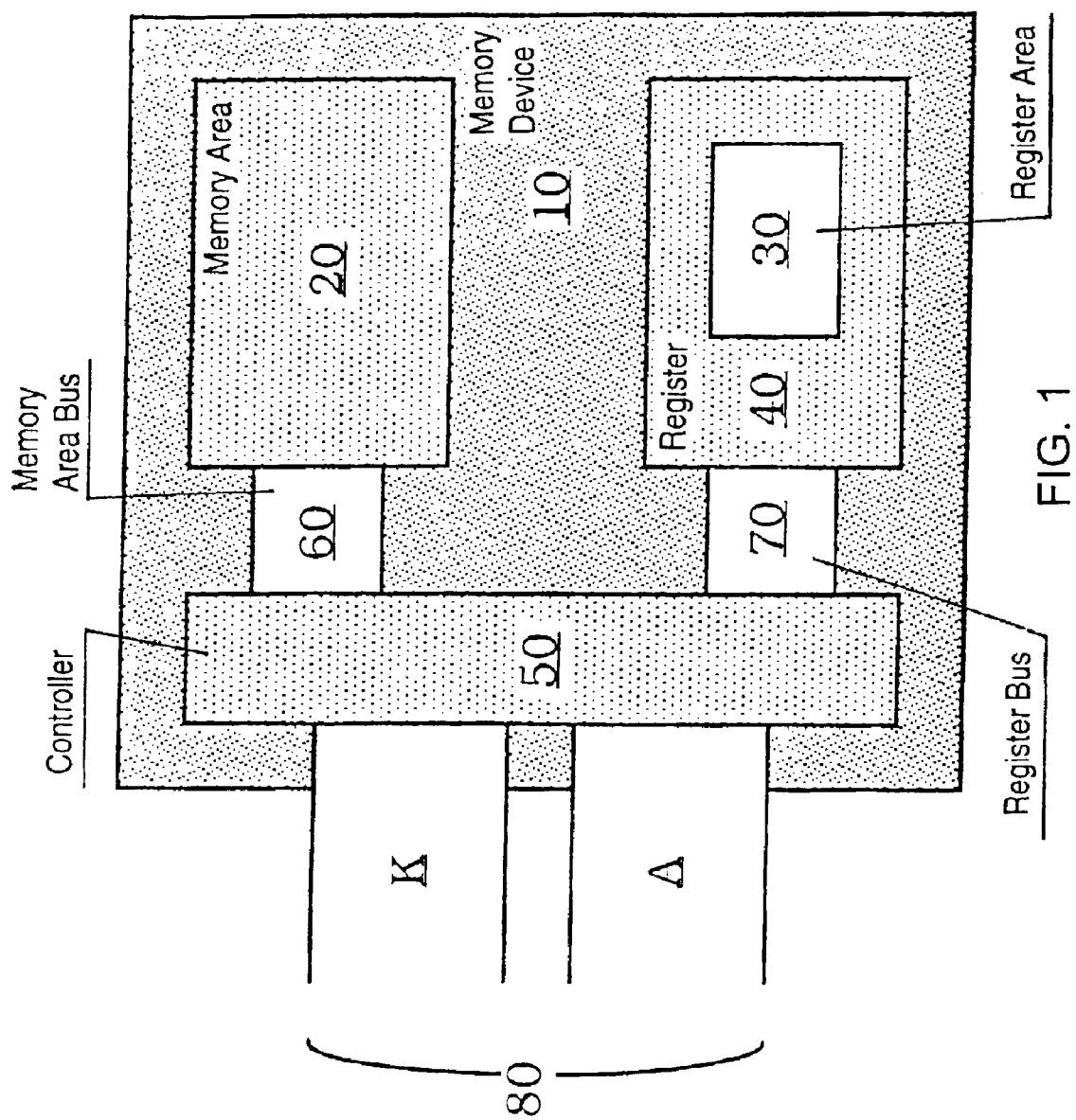
FIG. 1 is a block diagram of a semiconductor memory device according to the invention.

Referring now to the figures of the drawings in detail and first, particularly to FIG. 1 thereof, there is shown an embodiment of a semiconductor memory device 10 according to the invention that is illustrated—not to scale—in the block diagram of FIG. 1 has a memory area 20 and also a register 40. One part of the register 40, which is configured as a so-called mode register, is formed by the register area 30—provided according to the invention—for storing frequency information.

A bus device 80 is configured for the external communication of the semiconductor memory device 10 according to the invention. The bus device 80 is subdivided into an address bus A and a command bus K. The address bus A and the command bus K access a control device 50. For its part, the control device 50 of the semiconductor memory device 10 according to the invention accesses the memory area 20 or the register 40 selectively through a memory area bus 60 or through a register bus 70.

During operation, through the command bus K and the address bus A, during initialization of the semiconductor memory device 10 according to the invention, the register area 30 of the register 40 is addressed through the register bus 70 and the corresponding frequency information is stored there. Based upon the frequency information, during the initialization process, the semiconductor memory device 10 and, in particular, the memory area 20 thereof, is, then, adapted and/or configured for the purpose of optimizing operation with regard to the propagation times and/or with regard to the power consumption.

Figure 2B:
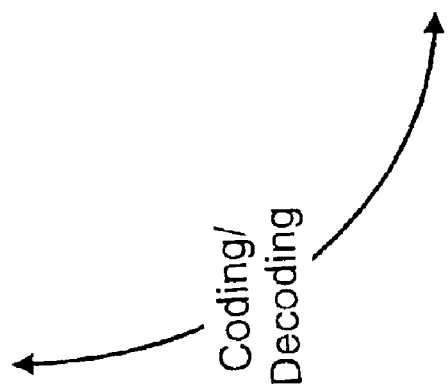
FIG. 2B is a table illustrating a coding scheme for operating frequencies according to the invention.
Figure 2A:
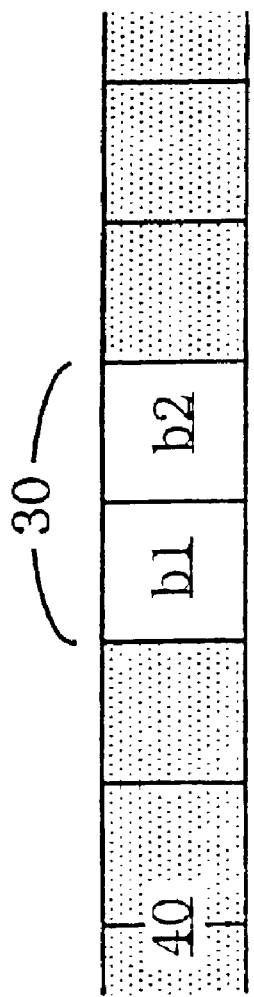
FIG. 2A is a diagrammatic illustration of a register area for operating frequencies according to the invention.

FIG. 2A shows a register 40, for example, a mode register, an embodiment of the semiconductor memory device 10 according to the invention, which contains a register area 30 for storing frequency information with a resolution of two bits b1 and b2.

FIG. 2B shows a coding table for the register area 30, where operating frequencies v corresponding to the different possible combinations of the values 0 or 1 for the bits b1 and b2 are identified with the values v1, v2, v3, and v4. Thus, the bit combination b1=0, b2=0 is allocated the operating frequency v=v1. The same applies correspondingly to the other bit combinations of the register area 30.

We claim:

1. A semiconductor memory device, comprising:
   at least one memory area; and
   a register area for at least one of receiving, storing, and providing frequency information selected from at least one of the group consisting of a present operating frequency, a clock frequency, and a frequency range for operating the semiconductor memory device, said register area storing the frequency information in binary code, said register area having at least one register bit, and each possible one of said present operating frequency and said clock frequency being assigned a given combination of values of said register bit.

2. The semiconductor memory device according to claim 1, wherein said register area receives the frequency information externally.

3. The semiconductor memory device according to claim 1, wherein said register area receives the frequency information internally.

4. The semiconductor memory device according to claim 1, wherein:
   said memory area has circuit components, circuit configurations, and functions; and
   said memory area at least one of adapts and configures said circuit components, said circuit configurations, said functions, and operation of said circuit components, operation of said circuit configurations, and operation of said functions to at least one of said present operating frequency and said clock frequency dependent upon the frequency information present in said register area.

5. The semiconductor memory device according to claim 4, wherein at least one of signal propagation times in said memory area and temporal coordination of operation of said memory area is at least one of adapted and configured dependent upon the frequency information in said register area.

6. The semiconductor memory device according to claim 4, wherein, based upon the frequency information in said register area, said circuit components, said circuit configurations, said functions, and operation of said circuit components, operation of said circuit configurations, and operation of said functions, are at least one of adapted and configured with regard to electrical power consumption.

7. The semiconductor memory device according to claim 6, wherein, according to an adapted power consumption, one of power provision and generation in said at least one memory area and said register area is at least one of adapted and configured dependent upon the frequency information in said register area.

8. The semiconductor memory device according to claim 7, including a number of power generator elements at least one of adapting and configuring the power provision and generation dependent upon the frequency information in said register area.

9. The semiconductor memory device according to claim 8, wherein:
   a relatively larger number of said power generator elements are activated at relatively higher operating frequencies; and
   a relatively smaller number of said power generator elements are activated at relatively lower operating frequencies.

10. The semiconductor memory device according to claim 4, wherein, based upon the frequency information in said register area, said circuit components, said circuit configurations, said functions of said memory area, and operation of said circuit components, operation of said circuit configurations, and operation of said functions of said memory area, are at least one of adapted and configured with regard to electrical power consumption.

11. The semiconductor memory device according to claim 4, wherein, based upon the frequency information in said register area, said circuit components, said circuit configurations, said functions, and operation of said circuit components, operation of said circuit configurations, and operation of said functions, are at least one of adapted and configured toward a relatively higher power consumption at relatively higher operating frequencies and toward a relatively lower power consumption at relatively lower operating frequencies.

12. The semiconductor memory device according to claim 4, wherein, based upon the frequency information in said register area, said circuit components, said circuit configurations, said functions of said memory area, and operation of said circuit components, operation of said circuit configurations, and operation of said functions of said memory area, are at least one of adapted and configured toward a higher power consumption at higher operating frequencies and toward a lower power consumption at lower operating frequencies.

13. The semiconductor memory device according to claim 1, including a register, said register area being part of said register.

14. The semiconductor memory device according to claim 1, including a mode register, said register area being part of said mode register.

15. The semiconductor memory device according to claim 1, wherein said at least one memory area and said register area is an SDRAM.

16. The semiconductor memory device according to claim 1, wherein said at least one memory area and said register area is a DDR-SDRAM.

17. A semiconductor memory device, comprising:
   at least one memory area; and
   a register area for at least one of receiving, storing, and providing frequency information selected from at least one of the group consisting of a present operating frequency, a clock frequency, and a frequency range for operating the semiconductor memory device, said register area storing the frequency information in binary code, said register area having a plurality of register bits, and each possible one of said present operating frequency and said clock frequency being assigned a given combination of values of said register bits.

18. The semiconductor memory device according to claim 17, wherein said plurality of register bits is two register bits.

19. The semiconductor memory device according to claim 17, wherein said plurality of register bits is three register bits.

20. A semiconductor memory device, comprising:
at least one memory area; and
a register area for at least one of receiving, storing, and providing frequency information selected from at least one of the group consisting of a present operating frequency, a clock frequency, and a frequency range for operating the semiconductor memory device;
said at least one memory area receiving the frequency information externally.

21. A semiconductor memory device, comprising:
at least one memory area; and
a register area for at least one of receiving, storing, and providing frequency information selected from at least one of the group consisting of a present operating frequency, a clock frequency, and a frequency range for operating the semiconductor memory device;
said at least one memory area receiving the frequency information internally.

22. The semiconductor memory device according to claim 21, including an internal frequency determining device determining one of said present operating frequency and said clock frequency and writing said one of said present operating frequency and said clock frequency to said register area.

23. A semiconductor memory device, comprising:
at least one memory area; and
a register area connected to said at least one memory area and adapted to at least one of receive, store, and provide frequency information selected from at least one of the group consisting of a present operating frequency, a clock frequency, and a frequency range for operating said at least one memory area, said register area storing the frequency information in binary code, said register area having at least one register bit, and each possible one of said present operating frequency and said clock frequency being assigned a given combination of values of said register bit.

24. A semiconductor memory device, comprising:
at least one memory area;
a register area adapted to at least one of receive, store, and provide frequency information selected from at least one of the group consisting of a present operating frequency, a clock frequency, and a frequency range for operating said at least one memory area; and
a controller for at least one of receiving and transmitting commands and addresses externally, said a controller connected to said at least one memory area and said register area; and said register area storing the frequency information in binary code, said register area having at least one register bit, and each possible one of said present operating frequency and said clock frequency being assigned a given combination of values of said register bit.

25. A method for operating a semiconductor memory device, which comprises:
providing at least one memory area with a register area;
storing frequency information relating to at least one information selected from a group consisting of a current operating frequency, a clock frequency and a frequency range for operating the semiconductor memory device in the register area of the memory area;
storing the frequency information in binary code; and
assigning a combination of values of at least one register bit to each provided possible frequency selected from the group consisting of the operating frequency and the clock frequency.

26. The method according to claim 25, which further comprises at least one of:
adapting at least one of circuit components, circuit configurations, functions, and operation of one of the semiconductor memory device and the memory area to the current operating frequency; and
configuring the at least one of the circuit components, the circuit configurations, the functions, and the operation of one of the semiconductor memory device and the memory area according to the frequency information.

27. The method according to claim 26, which further comprises at least one of adapting and configuring at least one of signal propagation times and temporal coordination of the operation of the memory area based upon the frequency information.

28. The method according to claim 26, which further comprises at least one of adapting and configuring electrical power consumption of the circuit components, the circuit configurations, the functions, and the operation of the memory area based upon the frequency information.

29. The method according to claim 26, which further comprises at least one of adapting and configuring electrical power consumption of the circuit components, the circuit configurations, the functions, and the operation of the memory area based upon the frequency information in the register area.

30. The method according to claim 29, which further comprises performing at least one of the adaptation and configuration toward a relatively higher power consumption at relatively higher operating frequencies and toward a relatively lower power consumption at relatively lower operating frequencies.

31. The method according to claim 29, which further comprises, according to an adapted power consumption, at least one of adapting and configuring at least one of power provision and power generation based upon the frequency information.

32. The method according to claim 31, which further comprises, according to the frequency information in the register area, at least one of adapting and configuring at least one of the power provision and the power generation through a number of activatable power generator elements in the register area.

33. The method according to claim 32, which further comprises activating a relatively larger number of power generator elements at relatively higher operating frequencies and activating a relatively smaller number of power generator elements at relatively lower operating frequencies.

34. A method for operating a semiconductor memory device, which comprises:
providing at least one memory area with a register area;
storing frequency information relating to at least one information selected from a group consisting of a current operating frequency, a clock frequency and a frequency range for operating the semiconductor memory device in the register area of the memory area;

storing the frequency information in binary code; and assigning a combination of values of at least two register bits to each provided possible frequency selected from the group consisting of the operating frequency and the clock frequency.

35. A method for operating a semiconductor memory device, which comprises:

providing at least one memory area with a register area;

storing frequency information relating to at least one information selected from a group consisting of a current operating frequency, a clock frequency and a frequency range for operating the semiconductor memory device in the register area of the memory area;

storing the frequency information in binary code; and assigning a combination of values of at least three register bits to each provided possible frequency selected from the group consisting of the operating frequency and the clock frequency.

36. A method for operating a semiconductor memory device, which comprises:

providing at least one memory area with a register area;

storing frequency information relating to at least one information selected from a group consisting of a current operating frequency, a clock frequency and a frequency range for operating the semiconductor memory device in the register area of the memory area; and receiving the frequency information within the memory area from external to the memory area.

37. A method for operating a semiconductor memory device, which comprises:

providing at least one memory area with a register area;

storing frequency information relating to at least one information selected from a group consisting of a current operating frequency, a clock frequency and a frequency range for operating the semiconductor memory device in the register area of the memory area; and writing the frequency information to the memory area from external to the memory area.

38. A method for operating a semiconductor memory device, which comprises:

providing at least one memory area with a register area;

storing frequency information relating to at least one information selected from a group consisting of a current operating frequency, a clock frequency and a frequency range for operating the semiconductor memory device in the register area of the memory area; and internally receiving the frequency information within the memory area.

39. A method for operating a semiconductor memory device, which comprises:

providing at least one memory area with a register area;

storing frequency information relating to at least one information selected from a group consisting of a current operating frequency, a clock frequency and a frequency range for operating the semiconductor memory device in the register area of the memory area; and writing the frequency information from within the register area to the memory area.

40. A method for operating a semiconductor memory device, which comprises:

providing at least one memory area with a register area;

storing frequency information relating to at least one information selected from a group consisting of a current operating frequency, a clock frequency and a frequency range for operating the semiconductor memory device in the register area of the memory area; and determining one of the current operating frequency and the clock frequency of the semiconductor memory device and writing the one of the current operating frequency and the clock frequency to the register area.

* * * * *